United States Patent [19]

Mishima et al.

[11] Patent Number: 5,633,516

[45] Date of Patent: May 27, 1997

[54] LATTICE-MISMATCHED CRYSTAL STRUCTURES AND SEMICONDUCTOR DEVICE USING THE SAME

[75] Inventors: Tomoyoshi Mishima, Shiki; Katsuhiko Higuchi, Kokubunji; Mitsuhiro Mori, Moriya-machi; Makoto Kudo, Hachioji; Chushiro Kusano, Tokorozawa, all of Japan

[73] Assignee: Hitachi, Ltd., Tokyo, Japan

[21] Appl. No.: 506,193

[22] Filed: Jul. 24, 1995

[30] Foreign Application Priority Data

Jul. 25, 1994 [JP] Japan ........................ 6-172252

[51] Int. Cl.$^6$ ............................... H01L 31/0328
[52] U.S. Cl. ................... 257/190; 257/194; 257/192; 257/200; 257/201
[58] Field of Search ..................... 257/190, 194, 257/200, 201, 192, 29, 185; 372/45, 46

[56] References Cited

U.S. PATENT DOCUMENTS

| | | | |
|---|---|---|---|
| 5,134,446 | 7/1992 | Inoue | 257/190 |
| 5,285,087 | 2/1994 | Narita et al. | 257/192 |
| 5,373,521 | 12/1994 | Takahashi | 372/45 |
| 5,449,928 | 9/1995 | Matsugatani et al. | 257/190 |
| 5,495,115 | 2/1996 | Kudo et al. | 257/190 |

OTHER PUBLICATIONS

Chang et al, "Lattice–Mismatched $In_{0.53}Ga_{0.47}As/In_{0.52}Al_{0.48}As$ Modulation–Doped Field–Effect Transistors on GaAs: Molecular–Beam Epitaxial Growth and Device Performance", J. Appl. Phys., 67 (7), Apr. 1, 1990, pp. 3323–3327.

Win et al, "Metamorphic $In_{0.3}Ga_{0.7}As/In_{0.29}Al_{0.74}As$ Layer on GaAs: A New Structure for High Performance High Electron Mobility Transistor Realization", Appl. Phys. Lett., 61 (8), Aug. 24, 1992, pp. 922–924.

*Primary Examiner*—Sara W. Crane
*Assistant Examiner*—Fetsum Abraham
*Attorney, Agent, or Firm*—Fay, Sharpe, Beall, Fagan, Minnich & McKee

[57] ABSTRACT

A semiconductor device has a lattice-mismatched crystal structure including a semiconductor film formed on a substrate with an intervening buffer layer. The buffer layer has a plurality of layers, including first sublayers, or regions, in which an element that controls the lattice constant is provided in increasing mole fraction, and second sublayers, or regions, in which the lattice constant is maintained. The first sublayers and second sublayers are provided in alternating fashion. The resulting device has an increased electron mobility as compared with the prior art.

32 Claims, 4 Drawing Sheets

LATTICE-MISMATCHED CRYSTAL STRUCTURES AND SEMICONDUCTOR DEVICE USING THE SAME

BACKGROUND OF THE INVENTION

1. Field of the Invention

The present invention relates generally to lattice-mismatched crystal structures, and more particularly to semiconductor devices such as electronic and optical devices that use lattice-mismatched crystal structures.

2. Description of the Related Art

Various problems arise from the use of lattice-mismatched crystal structures in semiconductor devices. The problems originate from the electrical characteristics of a semiconductor film crystal whose lattice constant is different in the direction parallel to the surface of the substrate from that of a substrate crystal on which it is grown (the so-called "lattice-mismatched crystal structure").

Chang et al, "Lattice-Mismatched $In_{0.53}Ga_{0.47}As/In_{0.52}Al_{0.48}As \ldots$", J. Appl. Phys., 67 (7), (1 Apr. 1990), pages 3323–3327, discuss a method of improving electron mobility in the channel of a high electron mobility transistor (HEMT) device having an InAlAs carrier supplying layer/InGaAs channel layer structure. Chang et al report that the electron mobility in the channel is improved by stepwise interposing a buffer layer having a structure comprising InGaAs crystal layers that are different in lattice constant between a GaAs substrate crystal and a film crystal constituting the active layer of the HEMT device, thereby reducing dislocations due to lattice mismatch. In the disclosed process, the active layer has a dislocation density (number of defects per unit area) of approximately $10^6$ cm$^{-2}$. The electron mobility is 8150 cm$^2$ at room temperature when the total buffer layer is 2.5 µm thick.

Win et al, "Metamorphic $In_{0.3}Ga_{0.7}As/In_{0.29}Al_{0.71}As$ layer on GaAs: ...", Appl. Phys. Lett., 61 (8) (24 Aug. 1992), pages 922–924, disclose another technique of improving the electron mobility in an HEMT device by reducing the dislocation due to lattice mismatch. Win et al form a single InGaAs graded buffer layer whose lattice constant varies continuously, or a buffer layer having a structure in which an InGaAs graded layer is sandwiched between layers whose lattice constants are constant, between a GaAs substrate crystal and an InAlAs film crystal constituting the active layer of an etched HEMT device. The degree of mismatch is low, as shown by the In composition of 0.3. The electron mobility is 8500 cm$^2$/Vs at room temperature for a buffer layer thickness of 1 µm.

In the devices resulting from the fabrication techniques disclosed in each of these articles, only HEMT crystals that are lattice-matched on the GaAs substrate are suitably utilized, and their electron mobilities are insufficient.

SUMMARY OF THE INVENTION

An object of the present invention is to provide a lattice-mismatched crystal structure (and a semiconductor device using the lattice-mismatched crystal structure) in which semiconductor film crystals are formed on a substrate which is different in lattice constant from the semiconductor film crystals in the direction parallel to the crystal face of the substrate. A semiconductor buffer layer is formed between the substrate and the semiconductor film crystals, having a thickness no greater than 1 µm. The electron mobility of the lattice-mismatched crystal structure is greater than 8500 cm$^2$/Vs at room temperature.

The present invention achieves this and other objects with a buffer layer constituted by a plurality of first regions and a plurality of second regions alternating in the layer stacking direction. A "first region" is that portion of the buffer layer that is formed by varying the composition of the element that controls the lattice constant. The "second region" is that portion of the buffer layer that is formed by holding constant the level of the lattice constant-controlling element. The lattice constants of the first regions increase toward the semiconductor film (and away from the substrate) in the layer stacking direction, making the first region sufficiently thick as to relax the lattice strain resulting from lattice mismatch between the semiconductor film and the substrate. The second regions are formed on and in contact with the semiconductor film side of the first regions, making constant the lattice constants of the second regions in the layer stacking direction, and making continuous the lattice constant of the buffer layer in the layer stacking direction.

The lattice constants of the first and second regions are determined by the ratio of composition of component elements common to the first and second regions. The ratio of common component elements can be greater in the first region in the vicinity of at least one interface between the first and second regions, than that in the second regions contacting at least the first region. Consequently, the buffer layer is particularly suitable in devices such as semiconductor lasers and bipolar transistors (minority carrier devices) in which a semiconductor film crystal is thick (200 nm or greater), in addition to majority carrier devices.

Although the relaxation of the lattice strain resulting from an increase in the lattice constant in the first region takes place bit by bit (differing by no more than 5%), the lattice strain still remains, not being completely relaxed to the point of removing the effect of dislocation. For this reason, the lattice constant in the first region at the interface between the first and second regions becomes smaller than desired, and is not equal to the lattice constant of the second region when the percent composition of the element controlling the lattice constant in the first region monotonously increases to the composition in the second region in a preferred embodiment. On the contrary, according to another preferred embodiment, in expectation of such a decrease in the lattice constant, the percent composition of the lattice constant-controlling element is greater in the first region than in the second region just before the interface between the first and second regions, whereby the lattice constants may be made equal to each other at the interface. Consequently, the possibility of dislocation in the second region is reducible.

Moreover, when the percent composition in the first region is greater than that in the second region, the composition is continuously decreased to equalize it with that in the second region. Thus, the efficiency of absorbing the dislocation can be improved and the electron mobility increased. Therefore, the buffer layer can be employed in minority carrier devices as well as in majority carrier devices.

DETAILED DESCRIPTION OF THE PREFERRED EMBODIMENTS

An HEMT crystal and an HEMT device will be described as preferred embodiments incorporating the teachings of the invention, with reference to FIGS. 1–6.

Figure 1:
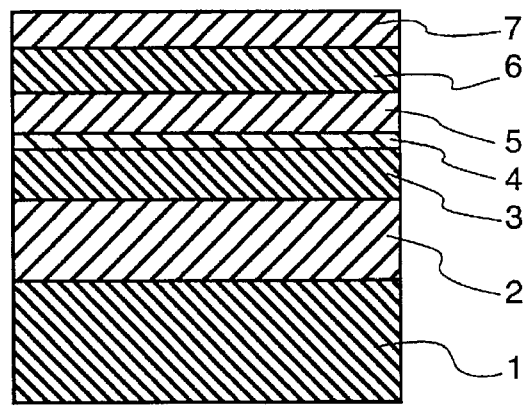
FIG. 1 is a cross-sectional view showing the layer structure of an HEMT crystal constructed according to the teachings of the present invention.

FIG. 1 shows a cross-sectional view of an HEMT crystal. On a semi-insulating GaAs substrate 1, an undoped InAlAs buffer layer 2,500 nm thick, is formed. An undoped InGaAs channel-forming layer 3 is formed on the buffer layer 2 to a thickness of 40 nm. Next, an undoped InAlAs spacer layer 4, 2 nm thick, is formed on the layer 3. On top of the spacer layer 4 is an n-type InAlAs carrier supplying layer 5 (15 nm thick, doped with $3\times10^{18}$ cm$^{-3}$ of Si), preferably having different Group III element contents than the buffer layer 2 (that is, the mole fraction, or content, or composition, of the Group III elements is different), an undoped InAlAs layer 6 (10 nm thick), and an n-type InGaAs cap layer 7 (doped with $3\times10^{19}$ cm$^{-3}$ of Si, 30 nm thick). All values are given to illustrate the invention only.

Figure 2:
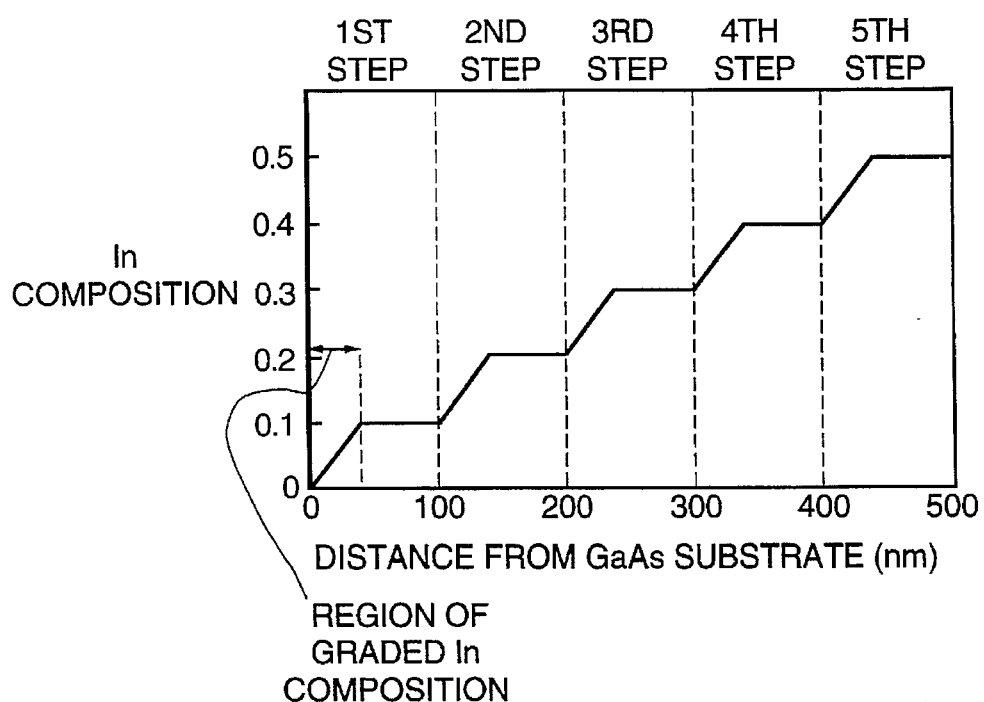
FIG. 2 shows a representative In composition profile of an InAlAs buffer layer of a lattice-mismatched crystal structure, which is particularly suitable for incorporation in a majority-carrier device.

In this example, the In composition in the InAlAs carrier supplying layer 5 and in the InGaAs channel layer 3 is 0.5. The In composition of the InAlAs buffer layer 2 is varied in five steps, as shown in FIG. 2, one step being defined as a combination of one first region and one second region in contact with the first region. For molecular beam epitaxy growth of the crystal, the temperature of the In-molecular beam source is varied to vary the In composition without requiring interruption.

The InAlAs buffer layer 2 comprises a plurality of layers formed by varying the ratio of thickness in each step of In composition in a first region where the In composition continuously varies, by varying the thickness of the buffer layer itself, and by varying the number of steps of In composition of the buffer layer. The "ratio of thickness" is defined as the thickness of the first region divided by the sum of thicknesses of the first region and a second region in which the In composition is kept constant.

Figure 3:
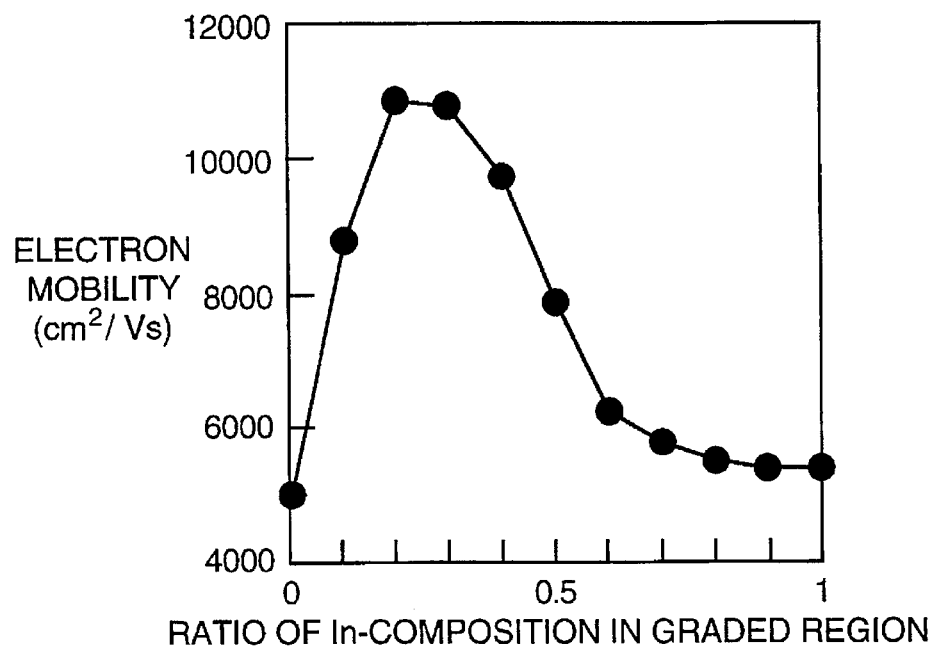
FIG. 3 graphically shows the relationship between electron mobility of the InGaAs channel layer and the ratio of thickness of the graded In-composition first region (first region)/(first+second regions) in an InAlAs buffer layer.

FIG. 3 graphically shows the relationship between electron mobility of a two-dimensional electron gas in the channel layer 3 at room temperature and the ratio of thickness with respect to the first region. In a range of the ratio between about 0.1 and about 0.45, the electron mobility exceeds 8500 cm$^2$/Vs.

Figure 4:
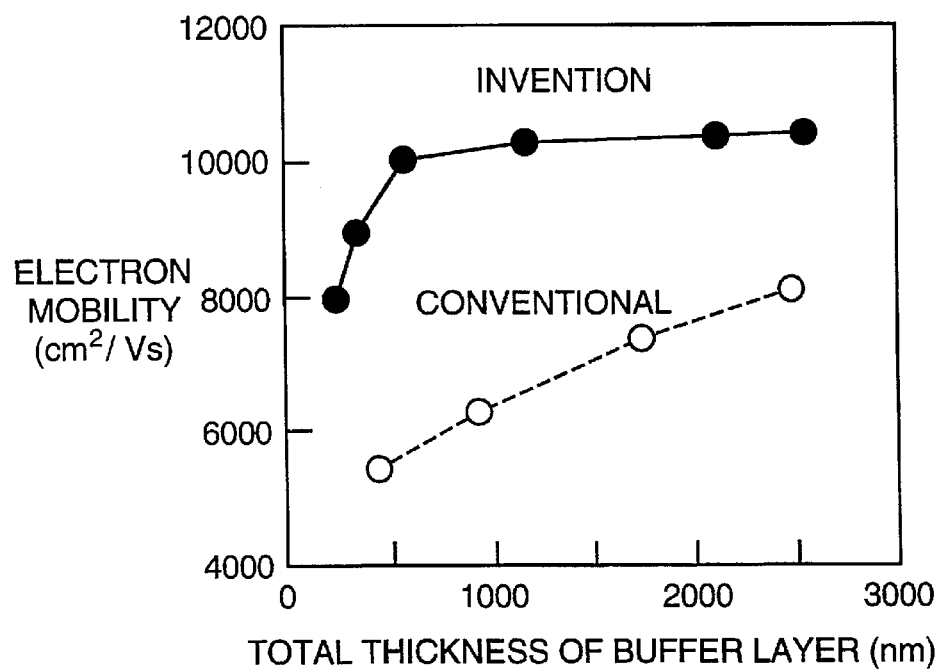
FIG. 4 graphically shows the relationship between electron mobility of an InGaAs channel layer and buffer layer thickness.

FIG. 4 illustrates the relationship between electron mobility of the two-dimensional electron gas at room temperature and the thickness of the buffer layer when the ratio of the thickness with respect to the first region is 0.2. High electron mobility is maintained even at a thickness of 1000 nm or below (submicron), the threshold at which electron mobility decreases in the prior art. In this example, the electron mobility is approximately 10,000 cm$^2$/Vs for a buffer layer thickness between 500 and 1000 nm, which is equivalent to that of a lattice-matched HEMT crystal on an InP substrate. However, since the buffer layer of the invention can be made thinner, the effect is to shorten the crystal growth time by at least half in comparison with the corresponding time of the prior art.

Figure 5:
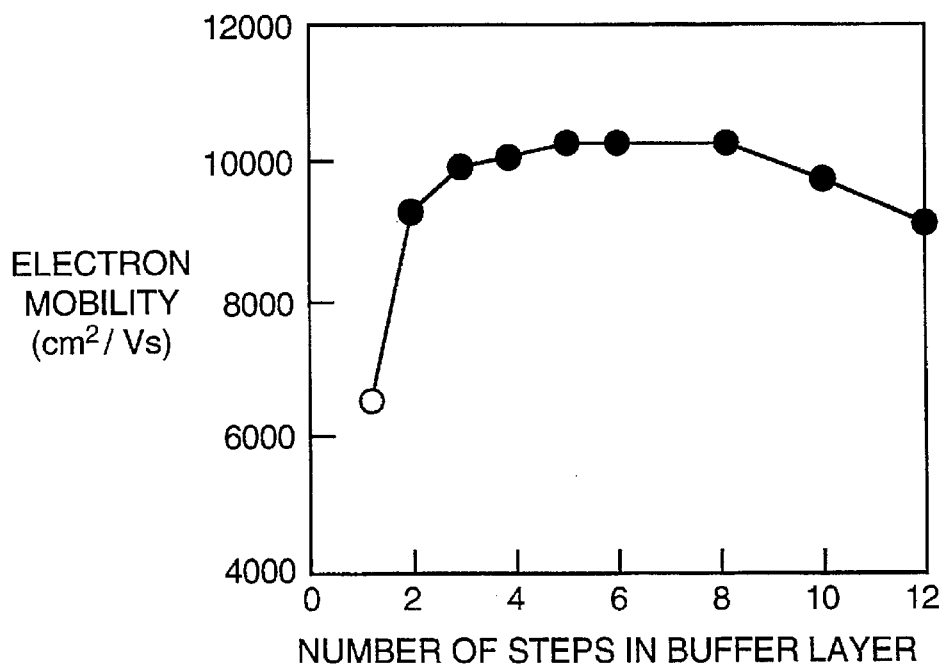
FIG. 5 graphically shows the relationship between electron mobility of the InGaAs channel layer and the number of In-composition steps in the buffer layer.

FIG. 5 illustrates the relationship between electron mobility of the two-dimensional electron gas at room temperature and the number of steps of In composition in the buffer layer 2 for a constant buffer layer thickness (illustratively 600 nm). The electron mobility exceeds the prior art value of 8500 cm$^2$/Vs when 2–9 steps were completed. However, when the number of steps exceeds nine, the electron mobility begins to decrease for the illustrated, fixed thickness of 600 nm. (It is considered that the reason for the decrease of electron mobility is that the thickness of the second region is decreased where the ratio of the composition absorbing dislocation is constant.)

The thickness corresponding to the first and second regions need not necessarily be the same throughout the steps. Further, although the point at which the In composition begins to increase is shown at 0 in FIG. 2, any value is acceptable below about 0.15 if it is practically difficult to achieve 0. Also, the buffer layer can be made of a quaternary material of InAlGaAs ($In_xAl_yGa_zAs$) having the specified In composition, where x, y, and z represent the mole fractions of In, Al, and Ga, respectively (x+y+z=1). As is known, the notation $In_xAl_yGa_zAs$ indicates that the quaternary material includes InAs, GaAs, and AlAs in any suitable composition satisfying x+y+z=1.

Thus, FIGS. 4 and 5 show that the lattice-mismatched crystal structure employing the buffer layer described above has an electron mobility at room temperature that exceeds 8500 cm$^2$/s, when the buffer layer has at least two graded steps. The improvement is achieved with a buffer layer that has a thickness of 1 micron or less.

The electron mobility increases at room temperature because the first region is sufficiently thick that the lattice strain accumulated therein is nevertheless relaxed (that is, the dislocation produced in the first region during its formation is a gradual dislocation, spreading the dislocation over the thickness of the first region). Although the dislocation produced in the first region extends to the second region, the dislocation disappears by the dislocation bonding, or dislocation termination, where the first and second regions meet. In other words, the dislocation produced in the first region is absorbed in the second region. The dislocation-absorbing efficiency is high at the second region because the dislocation is absorbed while it remains at a low level, which leads to the increase in electron mobility.

Moreover, since the second region is matched with the first region, a new dislocation is unlikely to occur in the second region. Consequently, the second region acts as a defect-free substrate crystal for the first region of the subsequent step, which means that the second region is in the same state as that of the substrate crystal on which the first step is formed. Thereafter, the same operation carried out to form the first step is repeated to form the second step.

This example is contrasted with a case wherein the buffer layer is formed of only one step. In the latter case, the change of the lattice constant is great because it occurs all at once in the first region. Thus, the dislocation is too great for the second region to absorb it satisfactorily.

Figure 6:
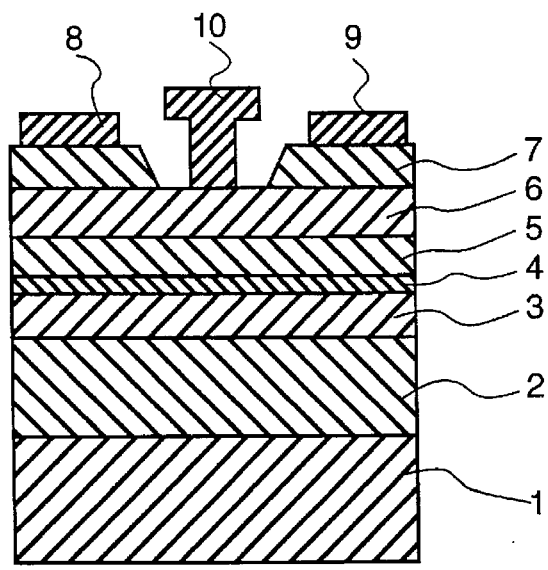
FIG. 6 is a cross-sectional view schematically showing the layer structure of an HEMT device constructed according to the teachings of the present invention.

To demonstrate the advantages of the invention, an HEMT device employing the HEMT crystal shown in FIG. 1 was fabricated. FIG. 6 schematically shows the device in cross-section. Using conventional photo- and electron beam lithographic techniques, the n-type InGaAs cap layer 7 was patterned and etched to form source and drain electrodes 8, 9 and a Schottky gate electrode 10. The gate length was 150 nm, and the thickness ratio with respect to the first region was 0.2 for a buffer layer 2 of 500 nm thickness.

The device having the composition described above had an extrinsic transconductance of 1.3 S/mm and a cutoff frequency of 250 GHz. These values are twice as great as those of the prior art, and compare favorably to those of a lattice-matched HEMT device formed on an InP substrate.

Figure 7:
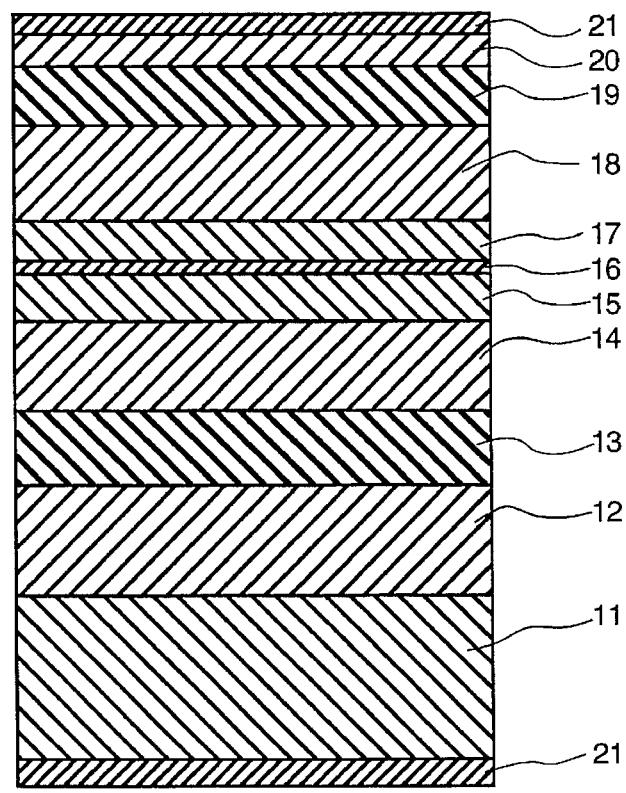
FIG. 7 is a cross-sectional view showing the structure of a semiconductor laser constructed according to the teachings of the present invention.

FIG. 7 shows a cross-section of a semiconductor laser constructed according to the teachings of the invention. As shown in FIG. 7, molecular beam epitaxy was utilized for forming the following layers on an n-type GaAs substrate 11: an n-type InGaAs buffer layer 12 (500 nm thick); an n-type InAlGaAs graded layer 13 (200 nm thick) having an ion composition ratio of 0.5, an Al composition ratio between 0 and 0.5, and a Ga composition ratio correspondingly between 0.5 and 0; an n-type InAlAs cladding layer 14 (1500 nm thick) having an In composition ratio of 0.5; an undoped InAlGaAs GRIN layer 15 (120 nm thick) having an In composition ratio of 0.5, a Ga composition ratio of 0 to 0.5, and a corresponding Al composition ratio between 0.5 and 0; an undoped InGaAs active layer 16 (15 nm thick) having an In composition ratio of 0.5; an undoped InAlGaAs GRIN layer 17 (120 nm thick) having an In composition ratio of 0.5, an Al composition ratio of 0 to 0.5, and a Ga composition ratio correspondingly between 0.5 and 0; a p-type InAlAs cladding layer 18 (1500 nm thick) having an In composition of 0.5; a p-type InAlGaAs graded layer 19 (200 nm thick) having an In composition ratio of 0.5, a Ga composition ratio of 0 to 0.5, and an Al composition ratio correspondingly between 0.5 and 0; and a p-type InGaAs contact layer 20 (100 nm thick) having an In composition ratio of 0.5. All values are illustrative only.

Silicon was employed as a dopant for determining the conductivity type of the n-type layers, which were doped to $2 \times 10^{18}$ cm$^{-3}$. Beryllium was employed as a dopant for determining the conductivity type of the p-type layers, which were doped to $1 \times 10^{18}$ cm$^{-3}$. The thickness of the structure between the n-type InAlGaAs graded layer 13 to the p-type InGaAs contact layer 20 was 3755 nm.

An ohmic electrode 21 was formed on the crystal surface and on the far side of the substrate from the multilayered structure, and the crystal was cut to a cavity length of 300 μm and a width of 200 μm to complete a semiconductor laser having a broad area contact structure.

Figure 8:
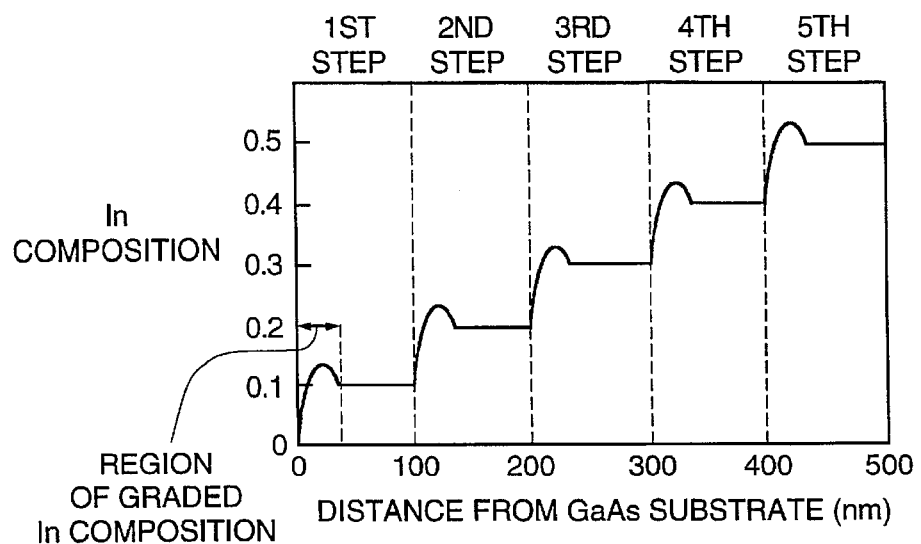
FIG. 8 illustrates the In-composition profile of an InGaAs buffer layer, which is suitable for use in minority- and majority-carrier devices.

The n-type InGaAs buffer layer 12 of the semiconductor laser had five steps. The In composition of each step, as shown in FIG. 8, was increased to a value approximately 5% higher than the ultimate value of the second region, at which the In composition was kept constant. Note that the entire portion during which the In composition varies is considered the first region. The thickness ratio with respect to the first region was set to 0.1 (in this example, the first region was continued until the layer thickness was increased by 10 nm, and the second region was continued until the layer thickness increased by 90 nm). The thickness of the first and second regions need not necessarily be the same in every step.

Although FIG. 8 shows that the In composition began to rise at point 0, this point may be set to any value below about 0.15 if the 0 setting is difficult to achieve. Further, the buffer layer may be made of a quaternary material of InAlGaAs whose In composition is as specified above.

The threshold current density of this device was 500 A/cm$^2$, equivalent to that of a lattice-matched semiconductor laser using an InP substrate. However, because a GaAs substrate is less expensive than an InP substrate, the invention is favorable. Moreover, by additionally forming an electronic device on the GaAs substrate to integrate the optical and electronic devices (OEIC integration), the utility of the invention is enhanced.

Although the invention has been described with respect to electrons, the carriers may be holes. Moreover, the manufacture of semiconductor devices exhibiting the excellent characteristics of the present invention is made feasible by using a lattice-mismatched crystal structure of the type described, and by forming an active region of the semiconductor device in the semiconductor film crystal.

Various modifications of the invention will become apparent to the person of ordinary skill upon reading the foregoing disclosure. All such modifications that basically rely upon the teachings through which the invention has advanced the state of the art are properly considered within the spirit and scope of the invention.

We claim:

1. A lattice-mismatched crystal structure, comprising:
   a substrate crystal;
   a semiconductor buffer layer 1 μm thick or less on the substrate crystal; and
   a semiconductor film having a lattice constant different from that of the substrate crystal in the direction parallel to a face of the substrate crystal;
   wherein the buffer layer includes a plurality of first regions and a plurality of second regions formed in multilayer, the lattice constants of the first regions in a direction parallel to the substrate crystal face increasing toward the semiconductor film in a layer stacking direction;
   wherein the first regions have a thickness sufficient to relax the lattice strain resulting from lattice mismatch with the substrate crystal;
   wherein the second regions are formed on and in contact with the semiconductor-film-side of respective ones of the first regions, the lattice constants of the second regions in the direction parallel to the substrate crystal face being constant in the layer stacking direction, and
   wherein the lattice constant of the buffer layer in the direction parallel to the substrate crystal face is continuous in the layer stacking direction.

2. A lattice-mismatched crystal structure as claimed in claim 1, wherein the lattice constants of the first and second regions in the direction parallel to the substrate crystal face are controlled by the composition of component elements common to the first and second regions, and the composition of the common component elements is greater in at least one first region in the vicinity of the interface between the at least one first region and a second region in contact therewith than that in the second region.

3. A lattice-mismatched crystal structure as claimed in claim 2, wherein the substrate crystal is formed of GaAs, the buffer layer is of InAlAs, and the closest-to-buffer side of the semiconductor film is of InGaAs.

4. A lattice-mismatched crystal structure as claimed in claim 2, wherein the substrate crystal is formed of GaAs, and the buffer layer and the closest-to-buffer side of the semiconductor film are of InAlGaAs with different group III element contents.

5. A semiconductor device including an active region formed in the semiconductor film in the lattice-mismatched crystal structure as claimed in claim 2.

6. A semiconductor device as claimed in claim 5, wherein the substrate crystal is formed of GaAs, the buffer layer is of InAlAs, and the closest-to-buffer side of the semiconductor film is of InGaAs.

7. A semiconductor device as claimed in claim 6, further comprising a field effect transistor;

wherein the substrate crystal is formed of semi-insulating GaAs;

the buffer layer is of an undoped InAlAs; and the semiconductor film includes, from the substrate crystal, in order, an undoped InGaAs channel layer, an undoped InAlAs spacer layer, an n-type InAlAs carrier supplying layer, an undoped InAlAs layer, and an n-type InGaAs cap layer, the n-type InGaAs cap layer being divided into a source and a drain region so that the undoped InAlAs layer under the n-type InGaAs cap layer may be exposed in the gate region, a source and a drain electrode respectively formed in the source and drain regions of the cap layer, and a gate electrode formed on the exposed portion of the undoped InAlAs layer.

8. A semiconductor device as claimed in claim 7, wherein the ratio of thickness of the first regions of the InAlAs buffer layer to the total thickness of the InAlAs buffer layer ranges from 0.1 to 0.45.

9. A semiconductor device as claimed in claim 5, wherein the substrate crystal is formed of GaAs, and the buffer layer and the closest-to-buffer side of the semiconductor film are of InAlGaAs with different Group III element contents.

10. A semiconductor device as claimed in claim 9, further comprising a semiconductor laser;

wherein the substrate crystal is formed of n-type GaAs;

the buffer layer is of n-type InGaAs; and the semiconductor film crystal includes, from the substrate crystal in order an n-type InAlGaAs graded layer, an n-type InAlAs clad layer, an undoped InAlGaAs GRIN layer, an undoped InGaAs active layer, an undoped InAlGaAs GRIN layer, a p-type InAlAs clad layer, a p-type InAlGaAs graded layer and a p-type InGaAs contact layer, and ohmic electrodes each formed on an n-type GaAs substrate crystal and a p-type InGaAs contact layer.

11. A lattice-mismatched crystal structure as claimed in claim 1, wherein the substrate crystal is formed of GaAs, the buffer layer is of InAlAs, and the closest-to-buffer side of the semiconductor film is of InGaAs.

12. A lattice-mismatched crystal structure as claimed in claim 1, wherein the substrate crystal is formed of GaAs, and the buffer layer and the closest-to-buffer side of the semiconductor film are of InAlGaAs with different Group III element contents.

13. A semiconductor device including an active region formed in the semiconductor film in the lattice-mismatched crystal structure as claimed in claim 1.

14. A semiconductor device as claimed in claim 13, wherein the substrate crystal is formed of GaAs, the buffer layer is of InAlAs, and the closest-to-buffer side of the semiconductor film is of InGaAs.

15. A semiconductor device as claimed in claim 14, further comprising a field effect transistor;

wherein the substrate crystal is formed of semi-insulating GaAs;

the buffer layer is of an undoped InAlAs; and the semiconductor film includes, from the substrate crystal, in order, an undoped InGaAs channel layer, an undoped InAlAs spacer layer, an n-type InAlAs carrier supplying layer, an undoped InAlAs layer, and an n-type InGaAs cap layer, the n-type InGaAs cap layer being divided into a source and a drain region so that the undoped InAlAs layer under the n-type InGaAs cap layer may be exposed in the gate region, a source and a drain electrode respectively formed in the source and drain regions of the cap layer, and a gate electrode formed on the exposed portion of the undoped InAlAs layer.

16. A semiconductor device as claimed in claim 15, wherein the ratio of thickness of the first regions of the InAlAs buffer layer to the total thickness of the InAlAs buffer layer ranges from 0.1 to 0.45.

17. A semiconductor device as claimed in claim 13, wherein the substrate crystal is formed of GaAs, and the buffer layer and the closest-to-buffer side of the semiconductor film are of InAlGaAs with different Group III element contents.

18. A semiconductor device as claimed in claim 17, further comprising a semiconductor laser;

wherein the substrate crystal is formed of n-type GaAs;

the buffer layer is of n-type InGaAs; and the semiconductor film crystal includes, from the substrate crystal, in order, an n-type InAlGaAs graded layer, an n-type InAlAs clad layer, an undoped InAlGaAs GRIN layer, an undoped InGaAs active layer, an undoped InAlGaAs GRIN layer, a p-type InAlAs clad layer, a p-type InAlGaAs graded layer and a p-type InGaAs contact layer, and ohmic electrodes each formed on an n-type GaAs substrate crystal and a p-type InGaAs contact layer.

19. A semiconductor wafer, comprising:

a multilayer semiconductor layer on a substrate crystal;

wherein the semiconductor layer includes a plurality of first regions and a plurality of second regions formed in multilayer in a layer stacking direction, the lattice constants of the first regions in the direction parallel to a face of the substrate crystal being different from that of the substrate crystal and increasing toward the semiconductor film crystal in the layer stacking direction;

wherein the first regions have such a thickness as to relax the lattice strain resulting from the lattice mismatch with the substrate crystal;

wherein the second regions are formed on and in contact with the opposite-to-the-substrate-crystal side of the first regions, the lattice constants of the second regions in the direction parallel to the substrate crystal face being constant in the layer stacking direction; and wherein the lattice constant of the semiconductor layer in the direction parallel to the substrate crystal face is continuous in the layer stacking direction.

20. A semiconductor wafer as claimed in claim 19, wherein the substrate crystal is formed of GaAs, and the semiconductor layer is of InAlGaAs.

21. A semiconductor wafer as claimed in claim 19, wherein the lattice constants of the first and second regions in the direction parallel to the substrate crystal face are controlled by the composition of component elements common to the first and second regions, and the composition of the common component elements is greater in the vicinity of at least one interface between the first and second regions than that in the second region in contact with at least one first region.

22. A semiconductor wafer as claimed in claim 21, wherein the substrate crystal is formed of GaAs, and the semiconductor layer is of InAlGaAs.

23. A semiconductor wafer as claimed in claim 21, wherein the substrate crystal is formed of GaAs, and the semiconductor layer is of InAlAs.

24. A semiconductor wafer as claimed in claim 19, wherein the substrate crystal is formed of GaAs, and the semiconductor layer is of InAlAs.

25. A lattice-mismatched crystal structure, comprising:
a substrate;
a multilayered buffer layer including alternating sublayers, every other sublayer beginning with the sublayer contacting the substrate having a lattice strain-absorbing characteristic characterized by respective lattice constants that increase in a direction perpendicularly away from a plane of the substrate, and the other sublayers having a lattice-absorbing characteristic characterized by lattice constants that are each unchanging in the direction perpendicular to the plane of the substrate; and
a plurality of layers formed on said buffer layer, each of said plurality of layers having a lattice constant that is different from a lattice constant of the substrate in a direction parallel to the substrate plane.

26. A lattice-mismatched crystal structure according to claim 25, wherein the buffer layer includes indium in a concentration that increases linearly in each sublayer having an increasing lattice constant up to the beginning of the next sublayer in the buffer layer that has an unchanging lattice constant.

27. A lattice-mismatched crystal structure according to claim 25, wherein the buffer layer includes indium in a concentration that increases in each sublayer having an increasing lattice constant up to a level higher than the indium concentration in the next sublayer in the buffer layer that has an unchanging lattice constant.

28. A lattice-mismatched crystal structure according to claim 25, wherein the substrate is a GaAs crystal.

29. A lattice-mismatched crystal structure according to claim 28, wherein the buffer layer comprises InAlAs, and wherein the layer formed on the buffer layer in contact therewith is formed of InGaAs.

30. A lattice-mismatched crystal structure according to claim 28, wherein the buffer layer comprises InGaAs, and the layer formed on the buffer layer in contact therewith is formed of InAlGaAs.

31. A lattice-mismatched crystal structure according to claim 28, wherein the buffer layer comprises InAlGaAs, and wherein the layer formed on the buffer layer in contact therewith is formed of InGaAs.

32. A lattice-mismatched crystal structure according to claim 28, wherein the buffer layer comprises InAlGaAs, and wherein the layer formed on the buffer layer in contact therewith is formed of InAlGaAs.

* * * * *